（12）United States Patent
Botman et al.

(10) Patent No.: US 9,255,339 B2
(45) Date of Patent: Feb. 9, 2016

(54) LOCALIZED, IN-VACUUM MODIFICATION OF SMALL STRUCTURES

(75) Inventors: Aurelien Philippe Jean Maclou Botman, Portland, OR (US); Milos Toth, Glebe (AU); Steven Randolph, Portland, OR (US); David H. Narum, Orono, MN (US)

(73) Assignee: FEI Company, Hillsboro, OR (US)

( * ) Notice: Subject to any disclaimer, the term of this patent is extended or adjusted under 35 U.S.C. 154(b) by 898 days.

(21) Appl. No.: 13/236,587

(22) Filed: Sep. 19, 2011

(65) Prior Publication Data

US 2013/0068611 A1 Mar. 21, 2013

(51) Int. Cl.
| | |
|---|---|
| *C25D 5/04* | (2006.01) |
| *C25D 5/02* | (2006.01) |
| *C25D 17/12* | (2006.01) |
| *C25D 21/04* | (2006.01) |
| *C25D 21/12* | (2006.01) |
| *C25D 5/00* | (2006.01) |
| *C25D 17/00* | (2006.01) |

(52) U.S. Cl.
CPC *C25D 5/003* (2013.01); *C25D 5/02* (2013.01); *C25D 5/04* (2013.01); *C25D 17/005* (2013.01); *C25D 17/12* (2013.01); *C25D 21/04* (2013.01); *C25D 21/12* (2013.01)

(58) Field of Classification Search
USPC .................................................. 205/117, 136
See application file for complete search history.

(56) References Cited

U.S. PATENT DOCUMENTS

| | | | |
|---|---|---|---|
| 3,408,274 | A | 10/1968 | Hoffman |
| 3,705,060 | A | 12/1972 | Stork |
| 4,876,112 | A | 10/1989 | Kaito et al. |
| 4,925,755 | A | 5/1990 | Yamaguchi et al. |
| 4,952,290 | A | 8/1990 | Carnarius et al. |
| 5,026,664 | A | 6/1991 | Hongo et al. |
| 5,104,684 | A | 4/1992 | Tao et al. |
| 5,827,786 | A | 10/1998 | Puretz |
| 6,262,426 | B1 * | 7/2001 | Zafiratos ................ 250/492.2 |
| 6,319,831 | B1 | 11/2001 | Tsai et al. |
| 6,365,896 | B1 | 4/2002 | van der Mast |
| 6,605,539 | B2 | 8/2003 | Lee et al. |

(Continued)

FOREIGN PATENT DOCUMENTS

| | | |
|---|---|---|
| JP | 7-18452 | 1/1995 |
| JP | 08-139099 | 5/1996 |
| WO | 2010019730 | 5/2010 |

OTHER PUBLICATIONS

Andricacos, P.C., et al., "Damascene copper electroplating for chip interconnections," IBM J. Res. Develop., Sep. 1998, pp. 567-574, vol. 42, No. 5.

(Continued)

*Primary Examiner* — Nicholas A Smith
(74) *Attorney, Agent, or Firm* — Scheinberg & Associates, PC; Michael O. Scheinberg; John E. Hillert

(57) ABSTRACT

A charge transfer mechanism is used to locally deposit or remove material for a small structure. A local electrochemical cell is created without having to immerse the entire work piece in a bath. The charge transfer mechanism can be used together with a charged particle beam or laser system to modify small structures, such as integrated circuits or microelectromechanical system. The charge transfer process can be performed in air or, in some embodiments, in a vacuum chamber.

16 Claims, 16 Drawing Sheets

(56) References Cited

U.S. PATENT DOCUMENTS

| | | |
|---|---|---|
| 6,667,530 B2 | 12/2003 | Toyoda |
| 6,693,358 B2 | 2/2004 | Yamada et al. |
| 6,696,360 B2 | 2/2004 | Ahn et al. |
| 6,720,248 B2 | 4/2004 | Ryo |
| 6,858,530 B2 | 2/2005 | Kane et al. |
| 6,913,681 B2 | 7/2005 | Matsuda et al. |
| 6,923,892 B2 | 8/2005 | Tatsuura et al. |
| 6,974,768 B1 | 12/2005 | Kailasam |
| 7,087,927 B1 | 8/2006 | Weaver et al. |
| 7,628,902 B2 * | 12/2009 | Knowlton et al. ............ 205/136 |
| 7,674,706 B2 * | 3/2010 | Gu et al. ........................ 438/625 |
| 7,955,486 B2 * | 6/2011 | Yu et al. ........................ 205/133 |
| 7,977,631 B2 | 7/2011 | Mulders et al. |
| 8,163,641 B2 | 4/2012 | Gu et al. |
| 2002/0006357 A1 | 1/2002 | McGeoch et al. |
| 2002/0074494 A1 | 6/2002 | Lundquist et al. |
| 2003/0121778 A1 | 7/2003 | Dodgson et al. |
| 2003/0173225 A1 | 9/2003 | Lowe |
| 2004/0148766 A1 | 8/2004 | Noguchi et al. |
| 2005/0227484 A1 | 10/2005 | Gu et al. |
| 2009/0288955 A1 * | 11/2009 | Haga ............................. 205/50 |
| 2011/0226819 A1 | 9/2011 | Mulders et al. |

OTHER PUBLICATIONS

Circuit Technology Center, Guidebook—A Comprehensive Resource for Circuit Board Rework and Repair, 4.6.3 Edge Contact Repair/Rework, Plating Method, Jul. 7, 2000, www.circuittechctr.com/guides/4-6-3.stml (8 pages).

Li, D.X., et al., "The Characterization of Nb—Al2O3, and Nb—MgO Interfaces in MBE Grown Nb—MgO—Nb—Al2O3 Multilayers," Acta Metall. Mater., 1992, pp. S237-S247, vol. 40.

Donnermeyer, A., "Scanning ion-conductance microscopy", Bielefeld University, 2007, 156 pages.

Suryavanshi, Abhijit P., et al., 'Probe-based electrochemical fabrication of freestanding Cu nanowire array,' Applied Physics Letters, Feb. 21, 2006, 3 pgs, vol. 88.

* cited by examiner

LOCALIZED, IN-VACUUM MODIFICATION OF SMALL STRUCTURES

TECHNICAL FIELD OF THE INVENTION

The present invention relates to modifying small structures using localized electrochemistry and is particularly useful in the field of nanotechnology.

BACKGROUND OF THE INVENTION

Micrometer and nanometer scale structures are used in many fields including biological sciences, microelectromechanical systems (MEMS) and semiconductor manufacturing. For example, semiconductor devices such as microprocessors can be made up of millions of transistors, each interconnected by thin metallic lines branching on several levels and electrically isolated from each other by layers of insulating materials. Biological sensors may include microscopic regions of biological material that detect an analyte, transducers and electronics that provide an interpretable detectable signal.

When a new nanoscopic device is first produced in a fabrication facility, the design typically does not operate exactly as expected. It is then necessary for the engineers who designed the device to review their design and "rewire" it to achieve the desired functionality. Due to the complexity of lithography processes typically used to fabricate microstructures, it typically takes weeks or months to have the re-designed device produced. Further, the changes implemented frequently do not solve the problem, or the changes expose another flaw in the design requiring additional design changes. The process of testing, re-designing and re-fabrication can significantly lengthen the time to market new semiconductor devices. Device editing—the process of modifying a device during its development without having to remanufacture the whole circuit—provides tremendous economic benefits by reducing both processing costs and development cycle times.

Charged particle beam systems, such as focused ion beam systems and electron beam systems, are used to create and alter microscopic structures because the charged particles can be focused to a spot smaller than one tenth of a micron. Focused ion beams can micro-machine material by sputtering that is, physically knocking atoms or molecules from the target surface or chemically assisted ion beam etching. Electron beams can be used in chemically-assisted electron beam etching.

Ion beams, electron beams, and laser beams can also be used to directly deposit material by a process known as beam-induced deposition or direct-write deposition. Direct write deposition allows a device designer to test variations of the device without undertaking the lengthy process of modifying photolithography masks and fabricating a new circuit from scratch. Direct write deposition can be achieved by using electron beam, ion beam, or laser beam stimulated chemical vapor deposition, in which a precursor species dissociates due to the effects of the beam. Part of the dissociated molecules is deposited onto the substrate, and part of the dissociated molecule forms volatile by-products, which eventually release from the substrate surface. The precursor can be a vapor that contains a metal species to be deposited. The metal is deposited only in the area impacted by the beam, so the shape of the deposited metal can be precisely controlled. An ion beam assisted deposition process is described, for example, in U.S. Pat. No. 4,876,112 to Kaito et al. for a "Process for Forming Metallic Patterned Film" and U.S. Pat. No. 5,104,684 to Tao et al. for "Ion Beam Induced Deposition of Metals."

It is often difficult to obtain high purity materials using direct write deposition, primarily due to the incorporation into the deposit of other components of the precursor molecules or the elements from the incident ion beam, such as gallium ions. This lack of control of composition, material purity, or internal structure often leads to undesirable properties in the deposited material. Tungsten and platinum deposited by focused ion beam (FIB)-induced deposition typically have resistivities greater than about 150 micro ohm centimeters ($\mu\Omega$-cm). Recently-introduced FIB copper depositions have resistivities of 30-50 $\mu\Omega$-cm. This is significantly higher than the resistivity of pure copper, which is less than 5 $\mu\Omega$-cm. As conductor sizes continue to shrink and processor speeds increase, it will be necessary to reduce the resistivity of conductors deposited during the device edit process, so that the smaller conductors can carry the required current. Similarly, the resistivity of material used to fill vias, metal filled holes that connect conductors in different layers, will need to decrease because the diameter of vias will decrease in the future so there is less conductive material in the hole to carry current. Low resistivity of the fill material and elimination of voids thus becomes even more important. Also, as via dimensions decrease, it becomes more difficult to cleanly sever a line at the bottom of the via without redepositing conductive material on the sidewalls of the via, which can short circuit other layers.

Furthermore, the materials that can be deposited by charged particle beam-induced deposition are limited by the availability of vapor phase precursors with requisite properties, that is, high residency time (stickiness) on the surface, lack of spontaneous decomposition, and decomposition in the presence of the beam to deposit the desired material and form a volatile byproduct. When suitable deposition precursors do exist for a particular material, the deposition rates are often limited by gas depletion effects and other factors.

Processes for applying metal globally to a circuit are known. For example, copper electroplating has been used by IC manufactures to make on-chip interconnection in the Damascene process, originally developed by IBM in 1997. The electroplating bath solutions are specially formulated by and commercially available from various semiconductor chemical supplier companies. The IC manufacturing electroplating technology, known as superfilling during chip manufacturing has the capability of filling vias having diameters of about 100 nm with a 1:5 aspect-ratio. Such processes, however, are applied globally to an entire chip.

U.S. Pat. No. 7,674,706 to Gu et al. for "System for Modifying Structures Using Localized Charge Transfer Mechanism to Remove or Deposit Material" ("Gu") describes depositing a localized drop of electrolyte on a portion of an integrated circuit and depositing or etching using an electric current flowing from a probe in the drop, through the electrolyte and then through the substrate. In one embodiment, the probe in the drop is replaced by using a charged particle beam to supply current, with the circuit being completed through the substrate.

FIG. 1 shows a method of localized electrochemical deposition of conductors using a micro or nano pipette in close proximity to a conductive surface. Such a method is described in Suryavanshi et al. in "Probe-based electrochemical fabrication of freestanding Cu nanowire array," Applied Physics Letters 88, 083103 (2006) ("Suryavanshi"). A glass pipette 102 holds an electrolyte solution 104, such as 0.05 M $CuSO_4$. A power supply 106 provides current for the electrochemical reaction, with an electric circuit being formed between a copper electrode 108 and a conductive substrate 110. The process is typically carried out in atmosphere under the observation of an optical microscope. A device that moves about a surface writing a pattern is referred to as a "nano pen."

SUMMARY OF THE INVENTION

It is an object of the invention, therefore, to provide a method for altering a microscopic structure, and in particular, to provide a method for selectively depositing high purity material onto, or removing material from, a microscopic structure Embodiments of the invention use a localized charge transfer mechanism to precisely deposit or remove material onto a substrate. In some embodiments, the invention can rapidly and precisely deposit metal conductors or rapidly remove metals or other conductive materials from a structure. Some embodiments use a nanocapillary having a diameter sufficiently small that liquid is extracted by capillary forces, instead of by hydrostatic forces, thereby improving control of the liquid dispensation.

In some embodiments, the electrochemical reaction is performed in a vacuum chamber of a charged particle beam system, such as an environmental scanning electron microscope, with a moveable nano pen defining a pattern or spot at or near which the deposition occurs. In some embodiments, the surface on which the material is deposited does not need to be electrically conductive—the electrical circuit can be completed, for example, by a charged particle beam or by a thin film of liquid that extends a significant distance from the bubble of electrolyte at the end of the nano pen.

Some embodiment provide an automated process, with the position and/or the state of the deposit being monitored, preferably by a scanning electron microscope, the image being analyzed by software and the nano pen movement being adjusted based on the image analysis.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

FIG. 15A shows the nanocapillary end after cutting.

FIG. 15B shows the nanocapillary of FIG. 15B with fiducial milled on it.

DETAILED DESCRIPTION OF PREFERRED EMBODIMENTS

Figure 1:
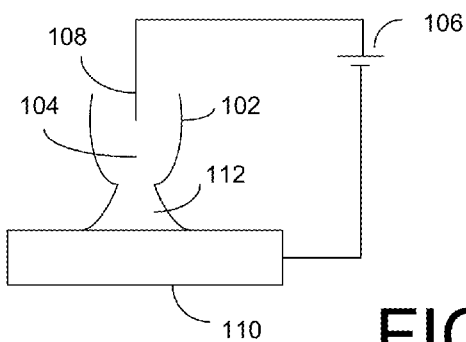
FIG. 1 shows a prior art electrochemical writing instrument.

In a preferred embodiment, the present invention provides a means to directly deposit or etch conductive material onto a substrate. A nano pen dispenses an electrolyte and an electric current through the electrolyte electrochemically deposits material onto the surface or etches material from the surface. A "nano pen," as used herein, comprises a device that dispenses small quantities of liquid to "write" or "etch" upon a substrate as the pen moves relative to the surface. Nano pens can comprise, for example, nanocapillaries, nano syringes, nanopipettes, etc.

Some embodiments of the invention can be used to deposit metals that are substantially pure. Because the metals are pure, they can have resistivities that are forty or more times lower than the resistivities of existing FIB-induced deposition of tungsten and platinum materials, and ten times lower than the resistivity of FIB-induced deposition of copper conductive materials. The resistivities are comparable to those of pure metals, for example less than 100 $\mu\Omega$-cm, more preferably less than 50 $\mu\Omega$-cm, even more preferably less than 25 $\mu\Omega$-cm or less than 10 $\mu\Omega$-cm, and most preferably less than 5 $\mu\Omega$-cm. The deposited metals can be greater than 90% (atomic percent) pure, more preferably greater than 95% pure and most preferably greater than 99% pure. Alloys could be deposited using solutions containing multiple metal ion species.

In some embodiments of the invention, the nano pen operates in the sample vacuum chamber of a charged particle beam system, such as an environmental scanning electron microscope (SEM). Environmental SEMs typically operate with the sample in a chamber at a pressure of between 0.07 and 50 Torr, which is much higher than the pressures in the vacuum chamber of a conventional SEM or FIB, typically less than $10^{-5}$ mbar. A liquid electrolyte used in some embodiments of the invention will raise the pressure in the vacuum chamber, but the higher operating pressure can still be within the operating limits of an environmental SEM. In some embodiments, the sample and/or the nano pen may be cooled to reduce the electrolyte vapor pressure and maintain working pressures in the environmental SEM sample chamber within the operating limits.

When the process is used in an environmental SEM, the SEM image can be used to position and direct the capillary, manually or automatically, for forming a deposition pattern and for monitoring the growth process with great precision. The high resolution of the SEM facilitates an automated process, in which the position of the nano pen and the material being deposited or etched is observed and interpreted using pattern recognition software. The position of the nano pen and the state of the process, such as the geometry of the deposit or etch, are measured and fed back to the process controller to correct the process in real time, that is, while it is being performed, providing a closed loop feedback system. Such embodiments overcome a limitation of prior art systems, such as that of Suryavanshi, in which the accuracy of the placement of the nano pen is limited by the resolution of an optical microscope.

Another advantage of operating the invention in a vacuum chamber is that a charged particle beam can induce charge transfer reactions so that the charged particle beam can be used as a virtual electrode. Prior art electrochemical, direct-write processes for directly depositing a material onto a surface are not compatible with insulating surfaces as the insulating surface prevents the electrochemical circuit from being formed. Embodiments of the present invention using a charged particle beam itself as a virtual cathode and a nanocapillary to locally apply the electrolyte allows deposition on an insulating surface.

Using a virtual electrode facilitates deposition on an insulating surface or on an isolated conductor. For example, an ion beam, such as a beam of gallium, argon, or other ions, can provide positive charges to induce anodic reactions for deposition. An electron beam, depending upon the primary beam energy, may induce either anodic or cathodic reactions. The electron beam supplies negative charges for a cathodic reaction. At lower energies, however, each electron in an electron beam can cause the removal of more than one electron from the species in the anodic region, resulting in a net flow of positive charges into the substrate. Thus, the electron beam may be used to electrodeposit material by providing a net positive charge or to etch material by providing a net negative charge.

When a charged particle beam is used to induce an electrochemical reaction, the other electrode to complete the circuit is typically provided at the nano pen, either by a wire in the nano pen or a coating on the nano pen. In some embodiments, an electron beam or ion beam can be used with a precursor gas to deposit a conductor to be used as a physical electrode. An electron beam or ion beam can be directed to the deposited conductor as a current source. A pattern can be drawn from the beam-deposited conductor using the nano pen, with the electric circuit being completed through the electrodeposited pattern to the electrolyte and finally through the conductor associated with the nano pen. Such embodiments overcome a limitation of prior art systems, such as that of Suryavanshi, because such embodiments do not require a conductive path from the deposited material through the substrate.

In other embodiments, the electrochemical circuit can extend from the conductor at the nano pen through the electrolyte and through a conductor in electrical contact with conductors within the work as described, for example, in Gu. For example, if the work piece is an integrated circuit, part of the electrochemical circuit can occur through the conductive layers of the circuit using the circuit's pins or probe touching part of a conductive layer for external connections.

In some embodiments, the fluid is delivered by capillary forces only, as opposed to hydrostatic pressure. Hydrostatic flow of fluid for localized delivery requires a large diameter at the interface of fluid to vacuum, resulting in large uncontrollable amounts of liquid being delivered. The electrolyte capillary bubble in these types of applications typically has a diameter between 1 µm and 50 µm in low vacuums using pressure driven flows. A smaller diameter of, i.e., about 100 nm is preferred for more precise deposition. When the diameter of a capillary is relatively large, liquid can be easily extracted by applying a pressure differential across the liquid in the capillary, that is, pressure is applied at the back end to push the liquid out of the capillary tip. As the diameter of the tip gets very small, an impractically large hydrostatic pressure would be required to force out the liquid, but the liquid can be extracted using capillary action by contacting the end of the nanocapillary with the substrate surface. Capillary action is caused by a combination of surface tension and adhesion of the liquid to a solid.

The diameter of the nano pen at which capillary action dominates over hydrostatic pressure for extracting liquid depends on the surface tension of the liquid, on the adhesion between the liquid and the material of which the nano pen is composed, and on the adhesion between the liquid and the material of which the substrate is composed. When the nano pen is composed of borosilicate glass, the liquid is ultrapure water, and the substrate surface is silicon, the diameter of the nano pen is preferably less than 20 µm, more preferably less than 5 µm and most preferably less than 1 µm.

Some embodiments use capillary forces to define fluid flow in a controlled manner, supply the fluid at a precise location on the surface, and deliver adequately small amounts of electrolyte to the surface. This enables the fluid to flow in a defined and controlled manner upon contact of the nano pen to the surface/substrate. Providing fluid flow only via capillary flow results in: (1) directed flow only upon contact of the nanocapillary to the surface; (2) small amounts of fluid can be delivered; (3) fluid can be supplied at a precise location on the surface (high resolution technique).

Direct-write processes have been limited to directing the charged particle beam toward the electrolyte solution bubble or just on the periphery of the bubble, as delivered by the nano pen. This has made it difficult to alter microstructures in electrically isolated areas. Applicants have found that deposition can be performed away from the electrolyte solution itself due to a very thin layer of solution that diffuses away from the bubble. Depositions 100 microns or more away from the bubble can be induced by directing a charged particle beam to the thin layer, allowing a pattern to be deposited on an insulting or isolated conducting surface away from the electrolyte bubble. The resolution of such a deposition is determined by the resolution of the charged particle beam and interaction volume of the electron beam in the substrate, rather than by the size of the bubble or the diameter of the nano pen.

Because the electrolyte is applied locally to plate a small area, no electroplating bath is needed. Most of the work piece remains dry. The specific plating solution used will depend on the application; many electroplating solutions are known in the art. For example, one suitable solution comprises ENTHONE ViaForm® Make-up LA, to which is added 5 ml/L of ENTHONE ViaForm® Accelerator and 2 ml/L ENTHONE ViaForm® Suppressor. The ENTHONE ViaForm® solutions are available from Enthone, Inc., West Haven, Conn. Metals such as Cu, W, Au, Pt, Pd, Ag, Ni, Cr, Al, Ta, Zn, Fe, Co, Re etc and alloys composed of these metals can also be written using the nano pen.

Figure 2:
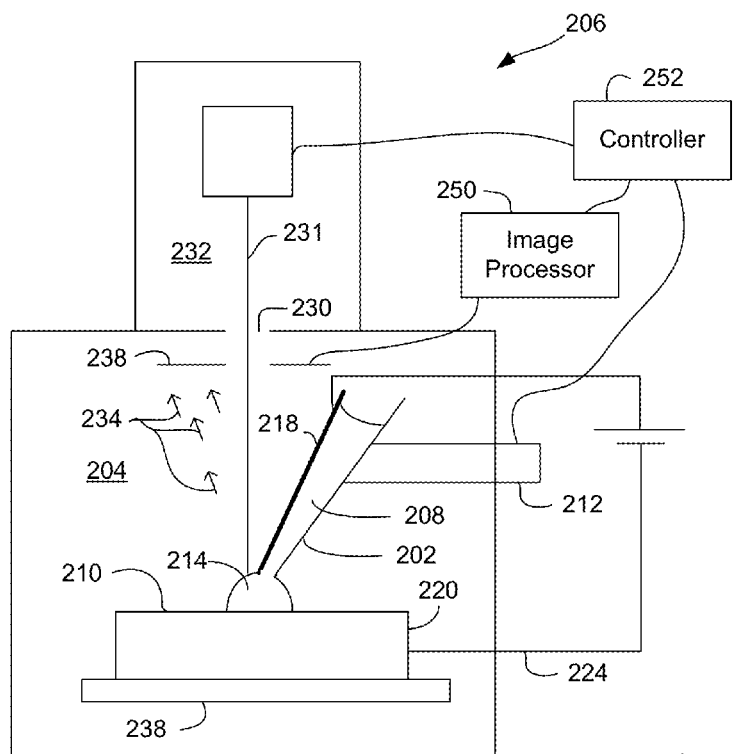
FIG. 2 shows a system for depositing pure metal or etching a metal.

FIG. 2 shows an embodiment of the invention in which a nanocapillary 202 is used for electrochemical deposition or etching within sample vacuum chamber 204 of a charged particle beam system 206, such as an environmental scanning electron microscope. Nanocapillary 202 is used to deliver electrolyte solution 208 to a surface 210. The electrolyte solution forms a bubble 214 on surface 210. The surface may be hydrophilic or hydrophobic, although preferably hydrophilic. Nanocapillary 202 is attached to a micromanipulator 212 that preferably provides motion in three axes and rotation along the capillary axis. In some embodiments, a modified gas injection system, which is a common accessory in charged particle beam systems, can be used as the micromanipulator. One electrode for electrochemical deposition is provided by a conductive coating 218 on, or a wire (not shown) in or on, nanocapillary 202. The electrode associated with the nanocapillary is positively biased. In some embodiments, surface 210 is conductive and is connected through the sample substrate 220 or through a surface probe (not shown) to an electrode 224 to provide a second contact for electrochemical processing. In other embodiments, the charged particle beam can function as a virtual cathode or anode, providing charges for the electrochemical reaction.

A pressure limiting aperture 230 maintains a pressure differential between an electron optical column vacuum chamber 232 and the sample vacuum chamber 204 to reduce dispersion of the primary electron beam 231 by gas molecules. Thus, evaporation of the electrolyte 208 increases pressure in the sample vacuum chamber 204, but much less so in the charged particle beam optical column vacuum chamber 232. The sample in some embodiments is preferably cooled, for example, by a cooler 240, such as a thermoelectric cooler, to increase the relative humidity at the substrate as compared to the bulk of the chamber. In some embodiments, the nanocapillary is also cooled, for example, by a thermoelectric cooler.

The electrochemical deposition or etching can be observed by the environmental scanning electron microscopy 206, in which electron beam 231 scans the region where material is being deposited and secondary electrons 234 are emitted upon impact of electron beam 231. The secondary electrons 234 are amplified by gas cascade amplification and detected by an electrode 238, forming an image whose brightness at each point corresponds to the current detected by the electrode 238. The image can be used to monitor and adjust the progress of the electrochemical deposition or etching to provide real time feedback to an operator. The image can be used to position and guide the nanocapillary 202 during deposition or etch.

In some embodiments, the deposition or etch can be automated. An image processor 250 uses pattern recognition software to recognize the nanocapillary and the substrate around it. A controller 252 controls the movement of the nanocapillary through micromanipulator 212 in accordance with a predetermined pattern. The image from the electron microscope can provide real time position information for closed loop feedback so that the position of the nanocapillary 202 can be controlled to produce the desired pattern on the surface 210. The deposition or etch pattern can also be observed to adjust the deposition process, such as the speed of the nanocapillary or the pressure at which the nanocapillary contacts the surface.

As described above, the diameter is preferably sufficiently small so that the electrolyte is forced out of the nanocapillary by capillary action when the capillary is in contact with the surface, rather than through hydrostatic pressure.

Figure 3:
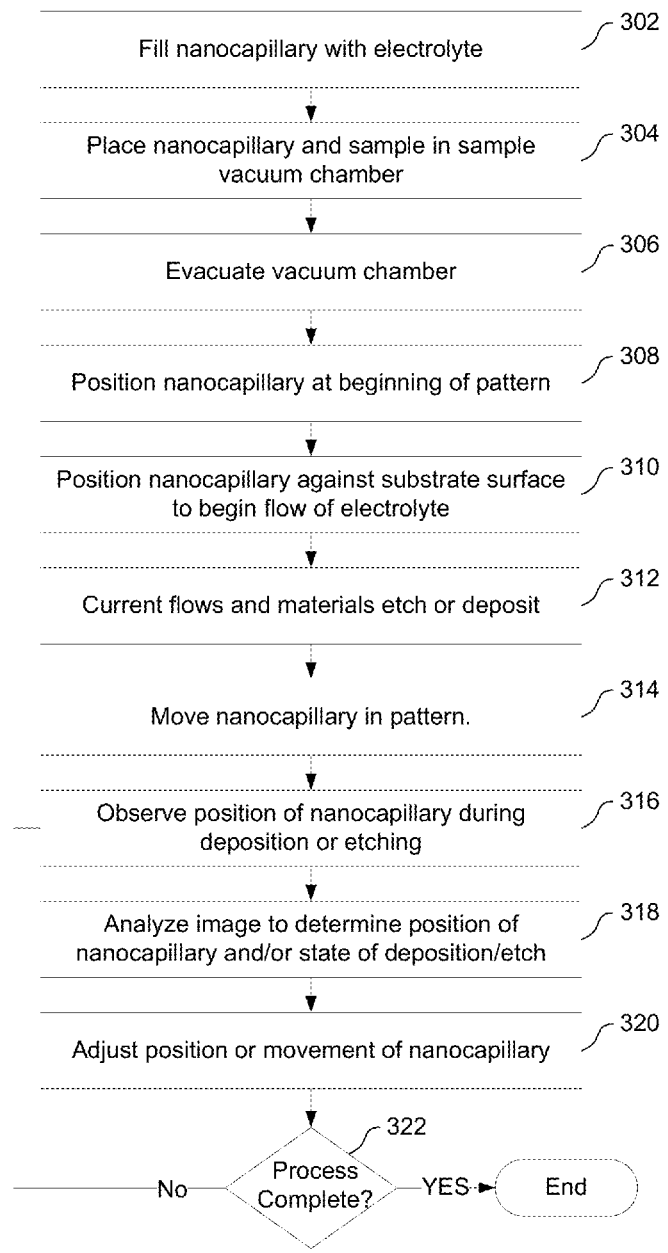
FIG. 3 is a flow chart showing the operation of the system of FIG. 2.

FIG. 3 is a flowchart showing the operation of the system of FIG. 2. In step 302, the nanocapillary is filled with electrolyte as described in more detail below. In step 304, the nanocapillary and sample are placed in the sample vacuum chamber, the nanocapillary being positioned in a micromanipulator so that it can be oriented, positioned, and moved. The sample is typically placed on a three axis stage. In step 306, the sample vacuum chamber is evacuated. In step 308, the nanocapillary is positioned at the beginning of the pattern to be deposited by observing the nanocapillary and the sample with the scanning electron beam. In step 310, the nanocapillary is moved against the surface of the sample, and the electrolyte begins to flow. In step 312, concurrent with step 310, current flows from the positively biased electrode at the nanocapillary through electrolyte to a second electrode provided by a conductive feature on the surface, either preexisting or deposited for this process, or by a charged particle beam. After electrochemical deposition of a pattern using the nanocapillary has commenced, current can flow through the deposited pattern to the conductive feature. As the current flows, material is deposited at the cathodic terminal or etched from the anodic terminal. In step 314, the nanocapillary is moved to deposit the desired pattern. In step 316, the position of the nanocapillary and the state of the deposition or etch process is observed using the scanning electron microscope. In step 318, the image is analyzed and in step 320, the position of the nanocapillary is adjusted. In decision block 322, the controller determined whether or not the process is complete. If the process is not complete, the process continues with step 316.

Figure 4:
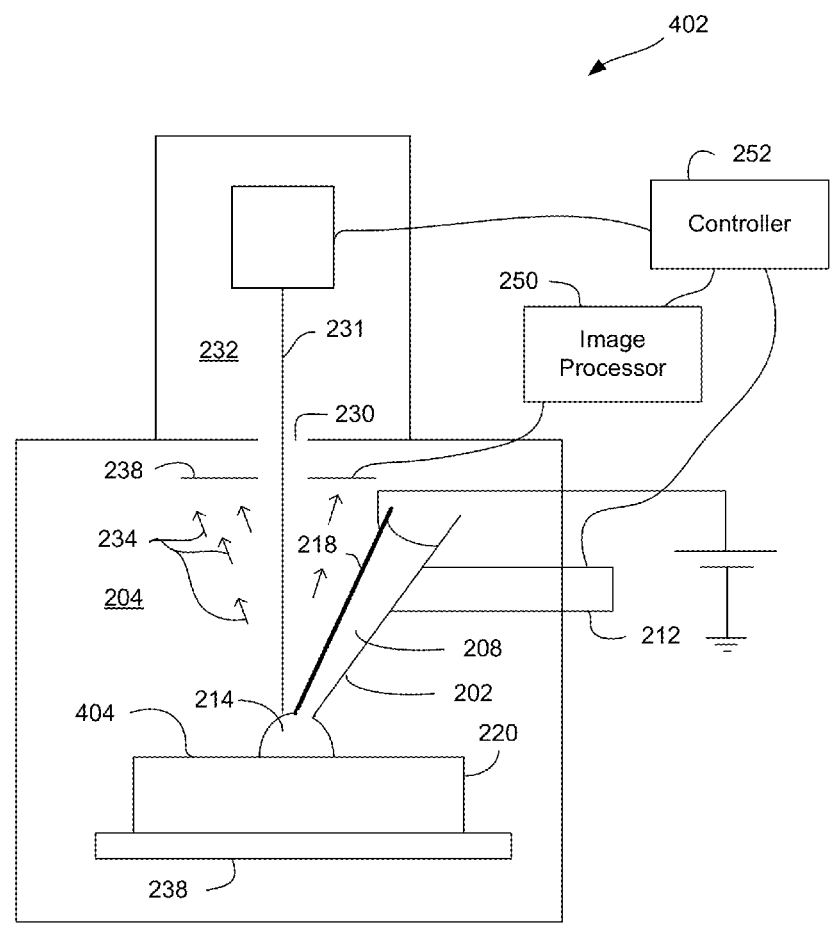
FIG. 4 shows a system that uses a charged particle beam as a virtual electrode.

FIG. 4 shows a charged particle beam system 402, similar to that shown in FIG. 2, except in charged particle beam system 402, the charged particle beam 231 provides a virtual cathode to allow electrochemical deposition on an insulating surface or onto an electrically isolated conductive surface. By using the charged particle beam, preferably an electron beam, as a virtual electrode, nanocapillary 202 can deposit material onto an insulating surface 404.

Capillary bubble 214 of the electrolyte solution 208 forms on the surface 404. Beam 231 is initially directed at the capillary bubble 214 and functions as a virtual cathode by, for example, providing electrons or ions in the beam current to complete the electrochemical circuit. After a conductive material is deposited and nanocapillary is moved away from its original position, the electron beam can be directed to any point along the deposited conductor. The process for using the system of FIG. 4 is the same process described in the flowchart shown in FIG. 3.

Figure 5:
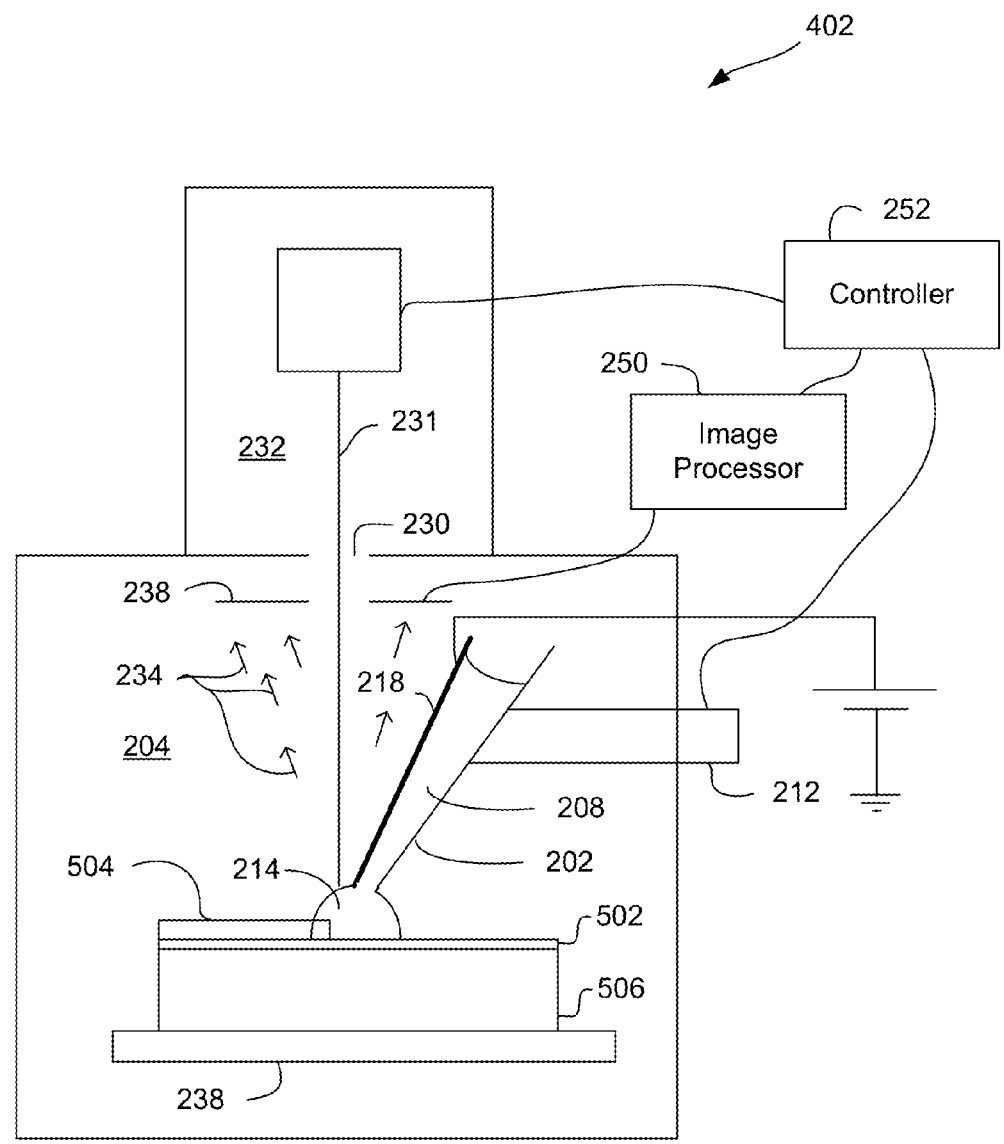
FIG. 5 shows a system in which electrodeposition is performed on an insulating surface adjacent a conductor.

FIG. 5 shows schematically an embodiment of the invention in which a beam induces electrochemical deposition on an insulating surface 502 by using a nearby electrically isolated conductive surface 504 on a substrate 506. The conductive surface 504 can be preexisting as part of the original device or it can be added, for example, through beam-induced deposition. An electrolyte bubble 214 is placed via nanocapillary 202 to overlap the conductive region 504 and the insulating surface 502 upon which the material is to be electrochemically deposited. A charged particle beam 231, preferably an electron beam, is directed to a location on the conductive surface 504. The point to which the charged particle beam 231 is directed can be a significant distance away from the electrolyte bubble 214. In some embodiments, charged particle beam 231 acts as a virtual cathode or current source. The other electrode is provided by a coating 218 or wire (not shown) at the nanocapillary to provide a positive bias relative to the substrate. Power supply 512 shows a connection to the nanocapillary and another connection to substrate 506. If the conductive layer 504 is well isolated, no current will flow through the substrate 506, and all current for the electrochemical reaction will be supplied by the charged particle beam. Material is then deposited on insulating region 504 through electrochemical deposition. Nanocapillary 202 can be maintained in a stationary position or can be moved to provide a pattern of deposited material. If nanocapillary 202 is maintained in a stationary position, the reaction can continue until the electrochemical cell is emptied of electrolyte or shorted by the growth of the deposited material, i.e. copper dendrite, from the contact pad to the nanocapillary 202. In general, growth occurs preferentially in the direction of the shortest distance between the capillary and the conductive surface.

Figure 6:
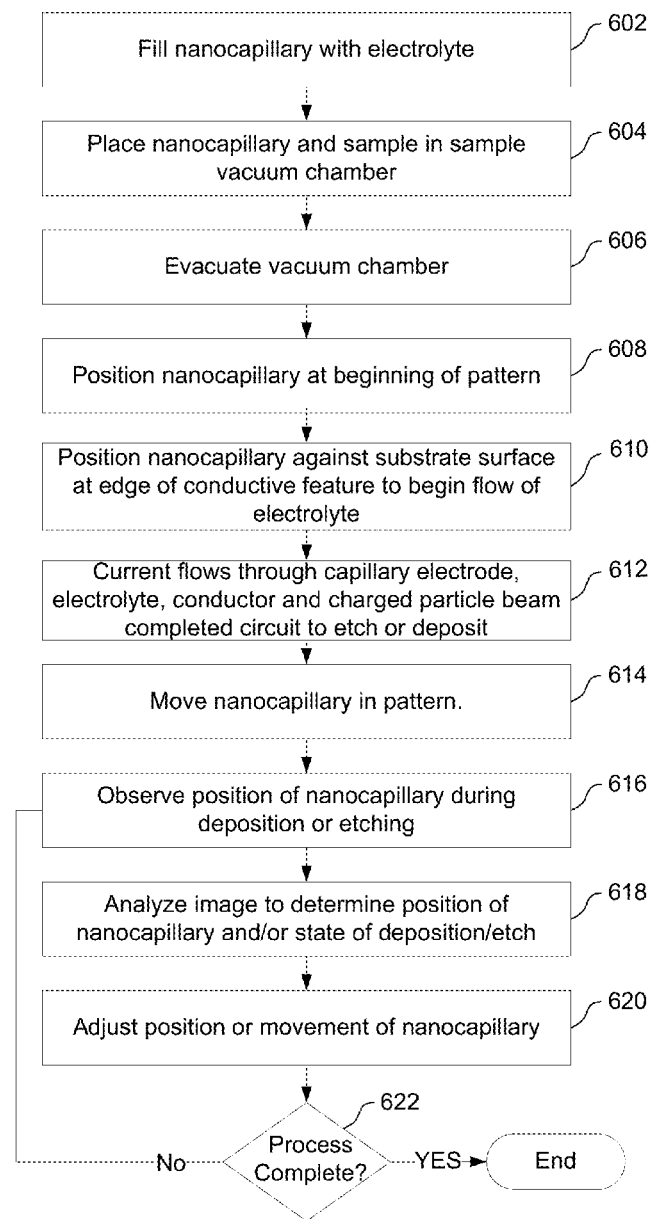
FIG. 6 is a flow chart showing the operation of the system of FIG. 5.

FIG. 6 is a flowchart showing the steps of the embodiment shown in FIG. 5. In step 602, the nanocapillary is filled with electrolyte as described in more detail below. In step 604, the nanocapillary and sample are placed in the sample vacuum chamber, the nanocapillary being positioned in a micromanipulator so that it can oriented, positioned, and moved. The sample is typically placed on a three axis stage. In step 606, the sample vacuum chamber is evacuated. In step 608, the nanocapillary is positioned at the beginning of the pattern to be deposited by observing the nanocapillary and the sample with the scanning electron beam. In this embodiment, the pattern is started at the edge of a conductive feature. In step 610, the nanocapillary is moved against the surface of the sample at the edge of a conductive feature, and the electrolyte begins to flow. In step 612, concurrent with step 610, current flows from the electrode at the nanocapillary through electrolyte, through the conductive feature and the circuit is completed by the charged particle beam. After electrochemical deposition of a pattern using the nanocapillary has commenced, current can flow through the deposited pattern to the conductive feature so that the circuit can be completed by the charged particle beam. As the current flows, material is deposited at the cathodic terminal or etched from the anodic terminal. In step 614, the nanocapillary is moved to deposit the desired pattern. In step 616, the position of the nanocapillary and the state of the deposition or etch process is observed using the scanning electron microscope. In step 618, the image is analyzed and in step 620, the position of the nanocapillary is adjusted. In decision block 622, the controller determined whether or not the process is complete. If the process is not complete, the process continues with step 616.

Figure 7:
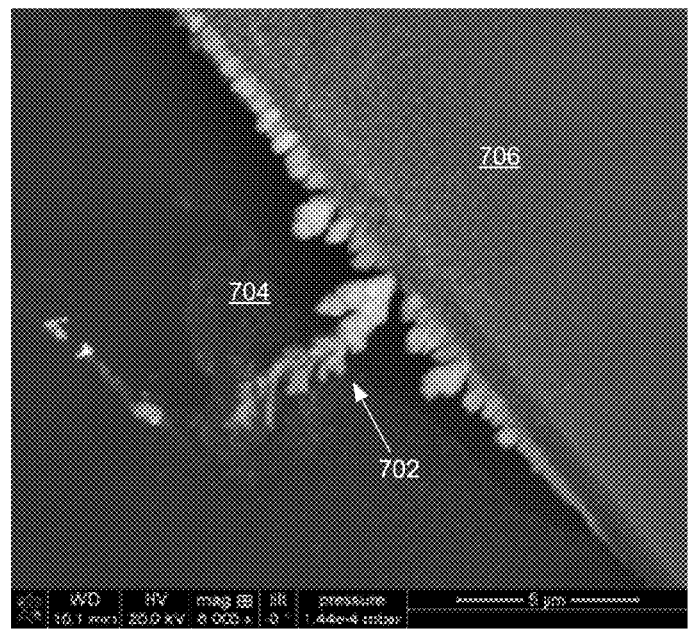
FIG. 7 is a photomicrograph of a metal deposited using the system shown in FIG. 5.

FIG. 7 shows a SEM image of pure copper dendrite 702 grown using the embodiment shown in FIG. 5 on an insulating surface 704 at the edge of a conductive surface 706. On average, the growth occurs preferentially in the direction of shortest distance from capillary to electrode.

Figure 8:
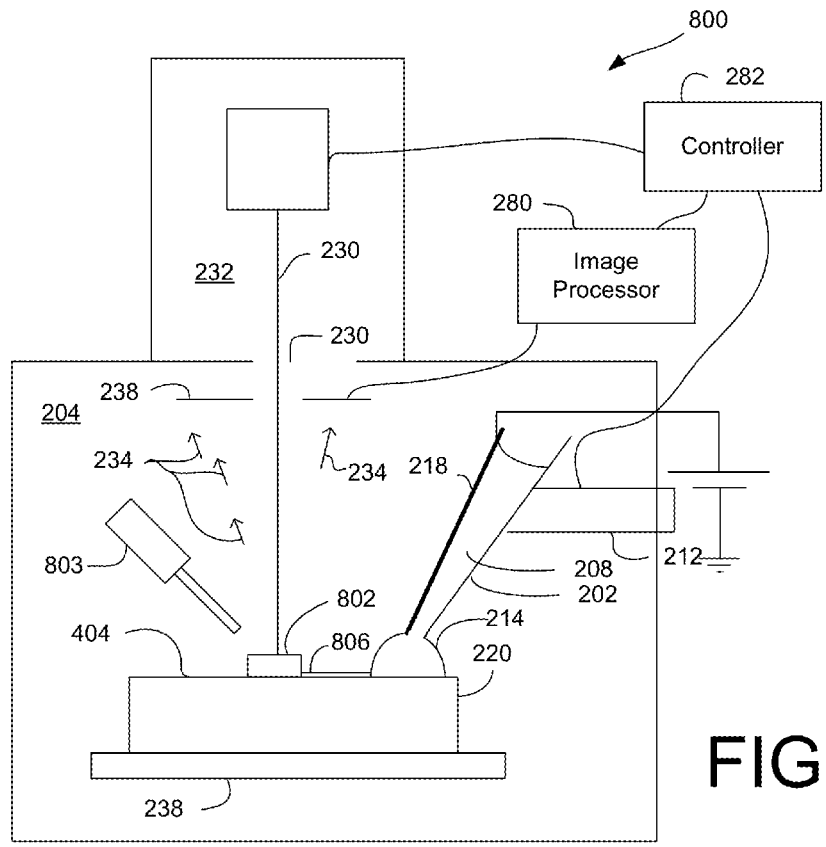
FIG. 8 shows a system in which a charged particle beam deposits a conductor to be used as an electrode in conjunction with the charged particle beam supplying charge for the reaction.

FIG. 8 shows a system similar to that of FIG. 6, in which the conductor that mediates electrodeposition is fabricated by beam-induced deposition. FIG. 8 shows a charged particle beam system 800 that includes a gas injection source 803 having a reservoir of precursor materials for use in beam-induced deposition. Beam-induced deposition can be used to deposit a cathode 802 on an insulating surface 404. A thin layer of material 806 can then be deposited on top of or extending from cathode 802 by moving the nanocapillary 202 in a desired pattern. A precursor gas suitable for FIB deposition of copper is hexafluoroacetylacetonato Cu(I) trimethyl vinyl silane (CAS 139566-53-3). Thus, a focused ion beam can be used to deposit a conductor to be used as a cathode, and then the electrochemical process can be used to deposit a lower resistivity, purer metallic layer on top of or extending from, the FIB deposited layer. An electron beam can also be used to deposit material. Other suitable deposition precursor gases include tungsten hexacarbonyl ($W(CO_6)$) and methylcyclopentadienyl trimethyl platinum. An electrolyte solution 208 is then locally applied using nanocapillary 202 as described with respect to FIG. 2. A conductor on or in nanocapillary 202 provides one electrode. The electrochemical circuit can be completed by the electron beam 231 impinging on the cathode 802, conductive probe (not shown) contacted to the cathode, or through the substrate 220.

The nanocapillary can be moved in an arbitrary pattern to deposit a conductor, and the beam can be directed to the cathode 804, to the electrolyte bubble, or to any position on the deposited conductor to complete the electrical circuit.

Figure 9:
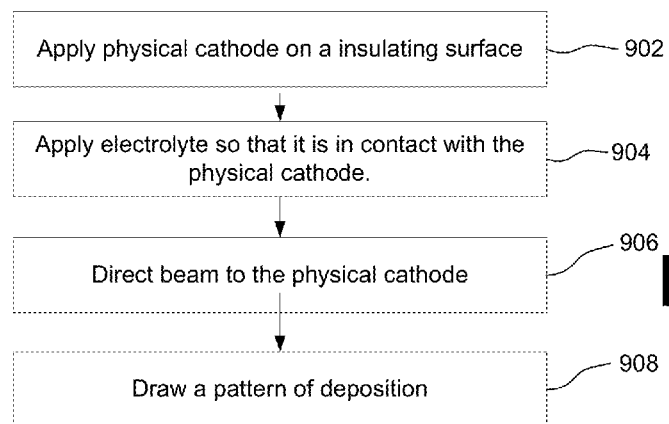
FIG. 9 is a flow chart showing the operation of the system of FIG. 8.

FIG. 9 shows a method of using the embodiment described in FIG. 8. Details that were described with respect to earlier embodiments are not repeated. Step 902 includes applying a physical cathode on an insulating surface, preferably by charged particle deposition. Step 904 includes positioning the nanocapillary so that the electrolyte bubble contacts the physical cathode. In step 906, the electron beam is directed to the physical cathode, thereby providing current to initiate the deposition reaction. Once deposition starts, the nanocapillary can be moved away from the cathode to draw a pattern of deposition in step 908. The deposited conductive material provides the electrical connection back to the cathode and completes the electrochemical circuit while the electrolyte is moved away.

Figure 10:
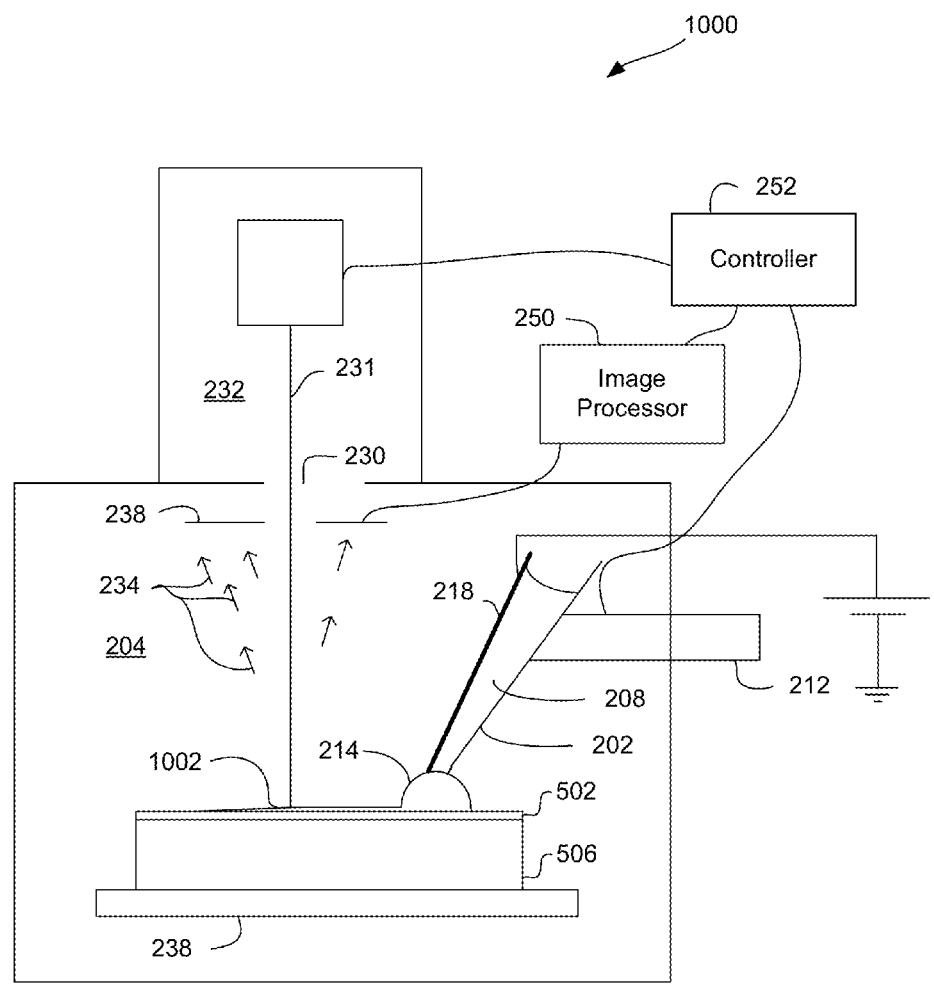
FIG. 10 shows a system in which a beam causes a deposit from a thin layer of electrolyte away from the electrolyte bubble at the tip of the nanocapillary.

FIG. 10 shows a charged particle beam system 1000 in which electrochemical deposition on an insulating surface 502 can be induced at a position remote from the electrolyte bubble 214 and remote from any conductor on the surface. Applicants have unexpectedly found that a very thin layer of electrolyte solution 1002 diffuses a significant distance from electrolyte bubble 214 but remains continuous enough to complete the electrochemical circuit. An electron beam directed to a position on the electrolyte solution layer 1002 will result in the reduction of the electrolyte component to electrodeposit a material. For example, the beam could reduce $Cu^{2+}$ from the thin meniscal layer to deposit copper from the electrolyte, with there still being sufficient electrical contact through the layer to complete the circuit and allow continuation of the reaction.

The electrolyte solution layer 1002 can be so thin that it may not be visible in a ESEM. The electrolyte solution layer 1002 replenishes itself from the bubble 214 as long as the distance away from nanocapillary 202 is not too great. This embodiment shows that it is not necessary to move a nano-pen to deposit a pattern; moving the beam alone within the thin layer will result in deposition in the desired pattern. Electrolyte solution layer 1002 allows direct write deposition of a conductor to be performed up to a 100 microns away from the electrolyte solution itself. The distance to which the fluid extends may be more than 3 times the diameter of the bubble, more than 7 times the diameter of the bubble, more than 20 times the diameter of the bubble or more than 50 times the diameter of the bubble.

The maximum distance will depend on the electrolyte, the surface, and the pressure in the sample vacuum and can be determined empirically by a skilled person for specific materials. This embodiment provides high resolution, localized electrodeposition without significant regard to the location and size of the electrolytic solution bubble. It had previously been assumed that the direct-write would need to be performed either by the charged particle beam either penetrating the visible bubble or just on the periphery of the visible bubble. Applicants have found that the deposition can be performed tens to a hundred microns away from the bubble, on an isolated area that would appear to be electrically isolated and not provide an electrochemical pathway.

Figure 11:
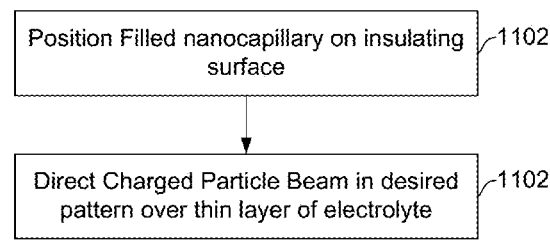
FIG. 11 is a flow chart showing the operation of the system of FIG. 10

FIG. 11 is a flow chart showing a process for using the embodiment of FIG. 10. Process details that are the same as those shown in FIG. 5 are not shown. In step 1102, the filled nanocapillary is positioned on an insulating surface, and a thin layer of electrolyte extends over the insulating surface. In step 1104, a charged particle beam is directed in a pattern over the thin layer of electrolyte.

Figure 12:
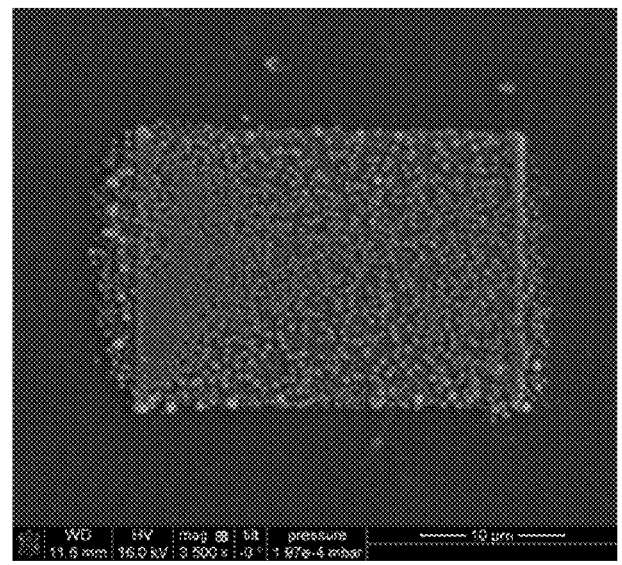
FIG. 12 is a photomicrograph of a metal deposited using the system shown in FIG. 10.

FIG. 12 shows an SEM image of a deposition made using the system shown in FIG. 10. The image shows highly pure copper grains deposited more than 50 microns from an electrolyte bubble located on an oxide film. The deposition in this case is on an isolated chrome film, and the nanocapillary was biased to +7 V.

In an alternative embodiment that uses the thin layer of electrolyte remote from the bubble, a pattern can be deposited starting from a conductor remote from the capillary bubble. Electron beam 231 can be directed to a point on a conductor 504 that is contacted by the thin electrolyte solution layer 1002, remote from the electrolyte bubble 214, and deposition will occur originating at the conductor. After conductive pattern 1004 deposit begins, electron beam 231 can be directed to a point on conductive pattern 1004 to guide the deposition pattern.

The electrochemical circuit in this embodiment is completed by coating 218 on nanocapillary 202 or by a conductor associated with the nanocapillary. This embodiment provides for electrochemical deposition at electrically isolated areas where there is no preexisting conductive pathway. This embodiment eliminates the need to deposit, either by beam-induced deposition by using the nanocapillary, a nearby cathode.

In still another variation, a negative bias is applied to the electrode at the nano pen in contact with the surface, and material is deposited at the position of the nano pen. The positive terminal can be supplied by a focused ion beam or by electron beam operated so as to eject more secondary electrons than are incident in the primary beam, thereby leaving a net positive charge.

Figure 13:
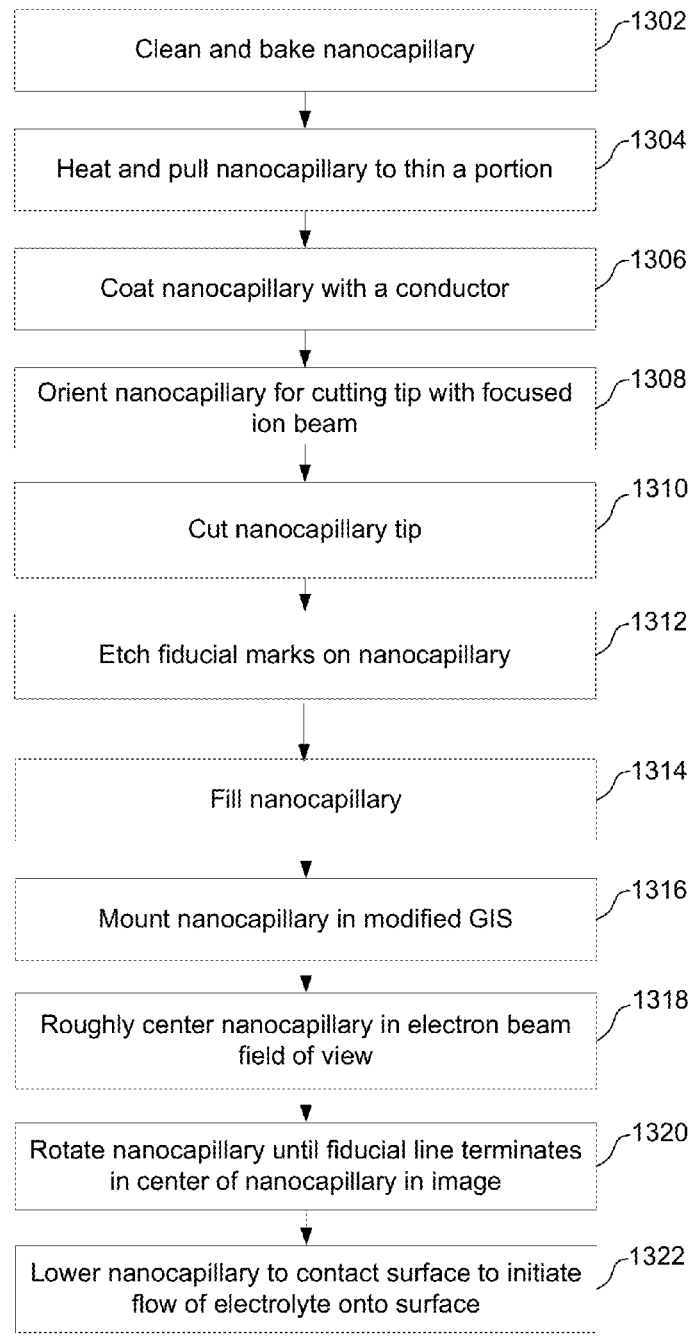
FIG. 13 is a flow chart showing a procedure for forming a nanocapillary.

FIG. 13 is a flowchart showing one method of preparing a nanocapillary for use with the present invention. The starting material can be, for example, a borosilicate tube having an inner diameter of 0.5 mm and having an internal filament to assist filling. Such nanocapillaries are commercially available from Sutter Instruments Company, Novato, Calif. In step 1302, the nanocapillary is cleaned and baked. In step 1304, the nanocapillary is heated and pressure is applied along the long axis of the tube to create small tips, preferably less than 100 nm, at the end of the nanocapillary. This step is referred to as "pulling," which can be performed using commercially available "pullers," also available from Sutter Instruments Company.

In step 1306, the nanocapillary is coated with a conductor. For example, the nanocapillary can be sputter-coated with gold. Before coating, the end of the nanocapillary that was not narrowed is preferably covered, for example, with aluminum foil, to prevent sputtered material from reducing the inner diameter of the tube at the end that will be filled. A specific procedure that has worked efficiently is to coat the nanocapillary for 8 minutes on each of two sides at 15 mA dc magnetron sputter current. Another specific procedure that has worked efficiently also is to coat for 4 minutes on each side with Cu at 15 mA power followed by 6 minutes on each side with Au at 15 mA; in this procedure the Cu serves as an adhesion layer for the Au coating.

In step 1308 the nanocapillary tip is oriented for cutting the tip using a focused ion beam to create a tip geometry that facilitates flow from the nanocapillary. The preferred nanocapillary tip is cut so that the opening from which the electrolyte flows is parallel to the substrate surface when the nanocapillary is positioned in the nanomanipulator. In some embodiments, the nanocapillary is mounted on a modified gas injection system. In some charged particle beam systems from FEI Company, the assignee of the present invention, a gas injection system can be mounted onto any of several ports on the sample vacuum chamber. The angle of each port to the vertical charged particle beam system axis is fixed. The tip of the nanocapillary is cut at an angle determined by the angle of the port in which it will be mounted. For example, in one system, the nanocapillary is oriented in the micromanipulator such that the capillary axis is oriented 30.4 degrees from the substrate surface, and so the tip is cut at 30.4 degrees from the capillary axis, as shown in FIG. 14D. Because of the configuration of a dual beam, with a vertical SEM column and a FIB column oriented at 57.5 degrees, special fixturing and a tilting stage are useful for cutting the tip at the preferred angle.

Figure 14A:
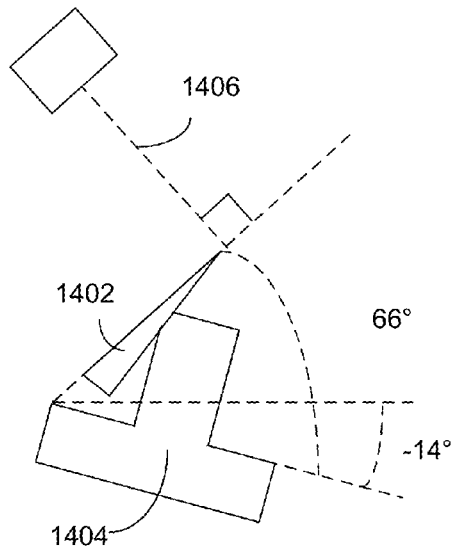
FIG. 14A is a diagram of the alignment of the nanocapillary relative to the FIB prior to milling the tip of the nanocapillary to achieve the specific geometry necessary to induce adequate flow.

FIG. 14A is a diagram showing how the nanocapillary 1402 is aligned relative to the FIB 1406 prior to milling the tip of the nanocapillary. Nanocapillary 1402 is mounted on stub 1404, which is angled at 66°. Stub 1404 is tilted −14° so that the nanocapillary is normal to FIB 1406.

Figure 14B:
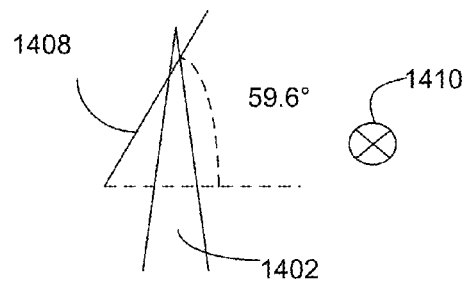
FIG. 14B is a diagram of the milling of the nanocapillary.

FIG. 14B is a diagram of the milling of the nanocapillary. The tip of nanocapillary 1402 is first centered in the FIB field of view. The FIB 1406, whose axis 1410 is oriented perpendicular to the page, is scanned along line 1408 to cut the tip of nanocapillary 1402 to cut the tip at 59.6° to a plane normal to the nanocapillary axis in step 1310. As the insulating capillary tends to accumulate a static charge that deflects the beam, care must be taken during fabrication of the nanocapillary.

Figure 14C:
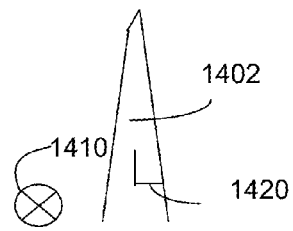
FIG. 14C is a diagram of the milling of fiducials on the nanocapillary.
Figure 14D:
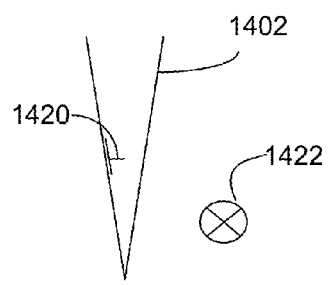
FIG. 14D is a diagram showing the alignment of a nanocapillary with a surface to locally deposit an electrolyte solution for electrochemical deposition

In step 1312, a very shallow fiducial mark 1420 comprising two perpendicular lines is milled onto the gold coating of nanocapillary 1402 as shown in FIG. 14C. The fiducial mark 1420 is imaged during operation by the electron microscope and are used to rotationally align the nanocapillary to the substrate surface. One line of the fiducial marks 1420 is centered along the nanocapillary axis and another line is perpendicular to the first line, extending fully over the edge of nanocapillary 1402 from the FIB viewpoint.

Figure 14E:
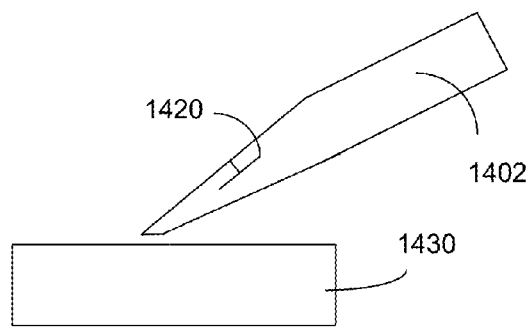
FIG. 14E is a side view showing the alignment of a nanocapillary with a surface as the nanocapillary is used to locally deposit an electrolyte solution for electrochemical deposition according to an embodiment of the disclosure.

In step 1314, the nanocapillary is filled with electrolyte as described in more detail below. After filling, the nanocapillary is mounted in a micromanipulator, preferably a modified GIS system, in step 1316. In step 1318, the nanocapillary is roughly aligned to the center of the electron beam. In step 1320, the nanocapillary is rotated in the field of view of the electron beam until in the electron beam image the horizontal line of the fiducial terminates at the center of the nanocapillary as shown in FIG. 14D. In FIG. 14D, the electron beam axis, as shown by marker 1422, is perpendicular to the page. FIG. 14E is a side view showing the preferred alignment of a nanocapillary with a surface when used to locally deposit an electrolyte solution for electrochemical deposition. In step 1322, the nanocapillary is lowered to contact the surface in order to initiate the flow of electrolyte onto the surface.

Figure 15A:
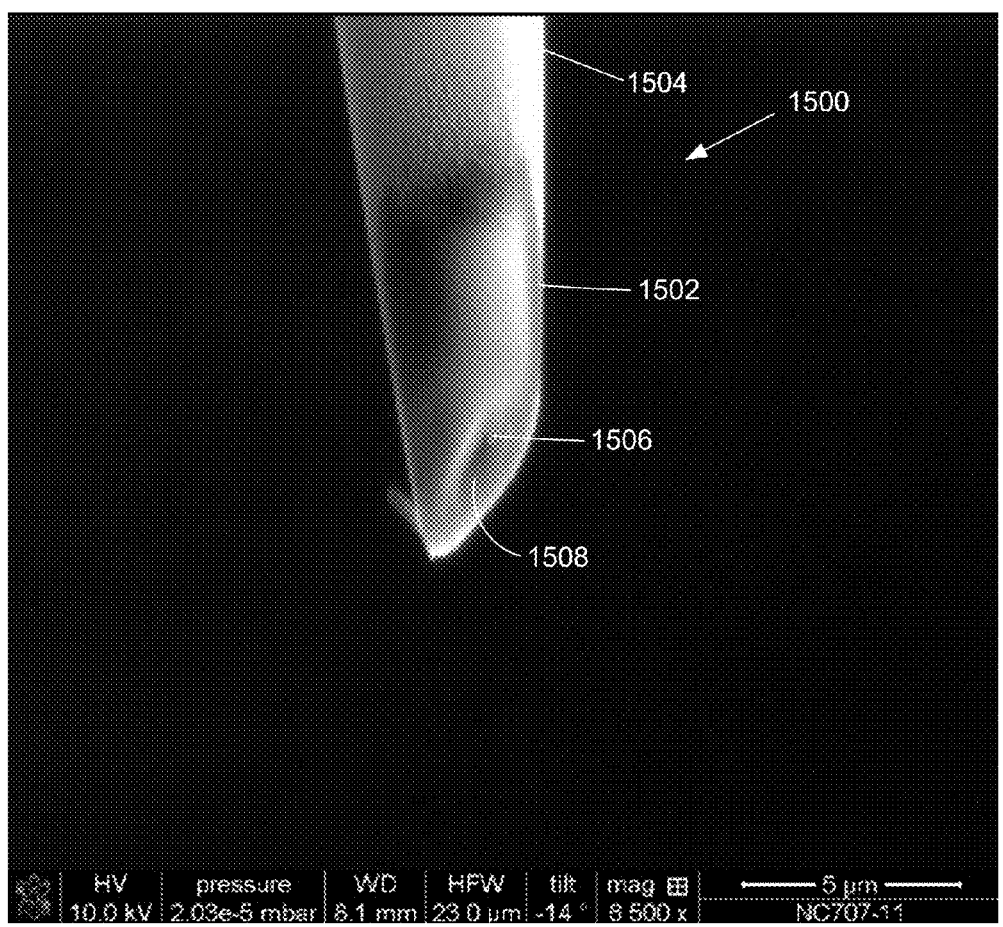
FIGS. 15A and 15B are photomicrographs of a nanocapillary after some of the processing steps described in FIG. 14.
Figure 15B:
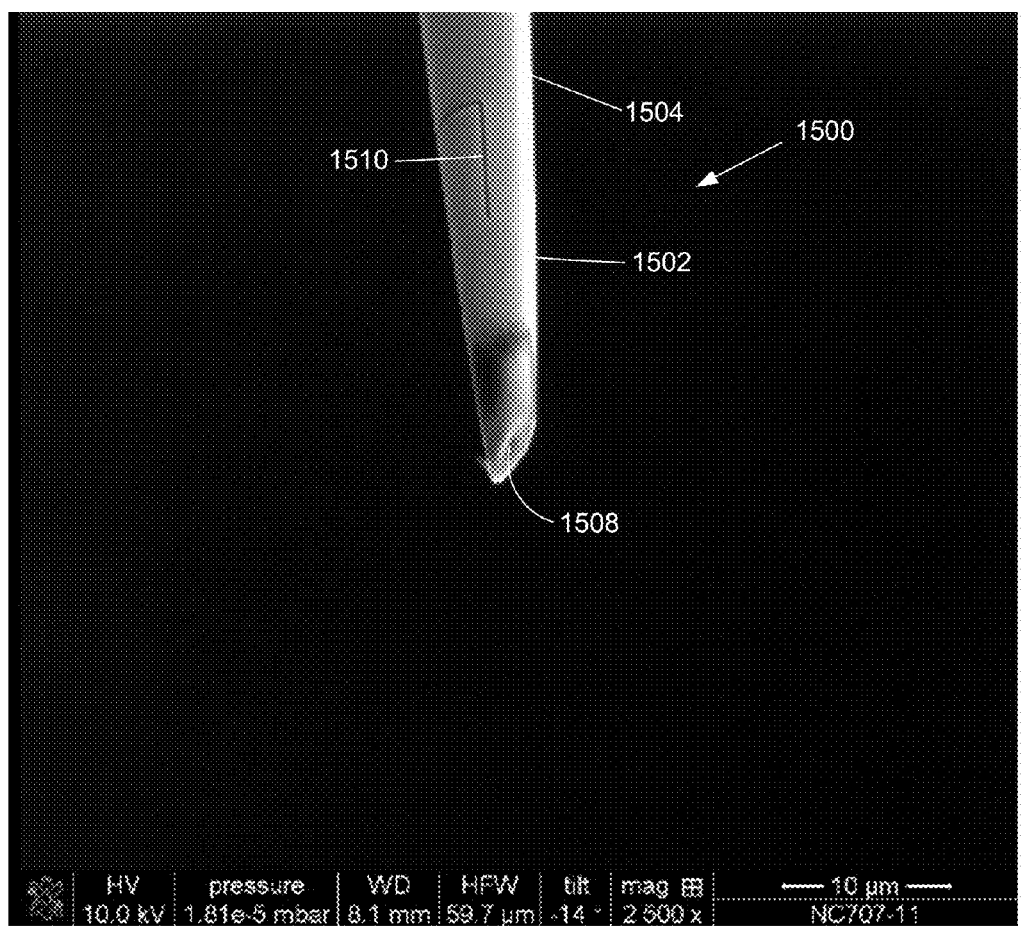

FIGS. 15A and 15B are photomicrograph of a nanocapillary 1500 having a glass tube 1502 cut at an angle and sputter coated with gold 1504. FIG. 15A shows an internal filament 1506 to facilitate capillary flow within the nanocapillary. The nanocapillary shown in FIG. 15 has a large diameter 1508 to illustrate the fabrication technique. FIG. 15B shows a smaller scale image of nanocapillary 1500 with an alignment fiducial 1510 visible.

After the nanocapillary is formed, it is filled. As described above, some embodiments of the invention use a nanocapillary having a sufficiently small inner diameter that the electrolyte flows by capillary action rather than by hydrostatic pressure. The small diameter of the nanocapillary makes filling difficult because of the surface tension of the liquid filling. Reliable and reproducible capillary flow when the nanocapillary touches the substrate within a vacuum chamber depends on the geometry of the tip of the nanocapillary and adequate filling of the nanocapillary with electrolyte.

Figure 16:
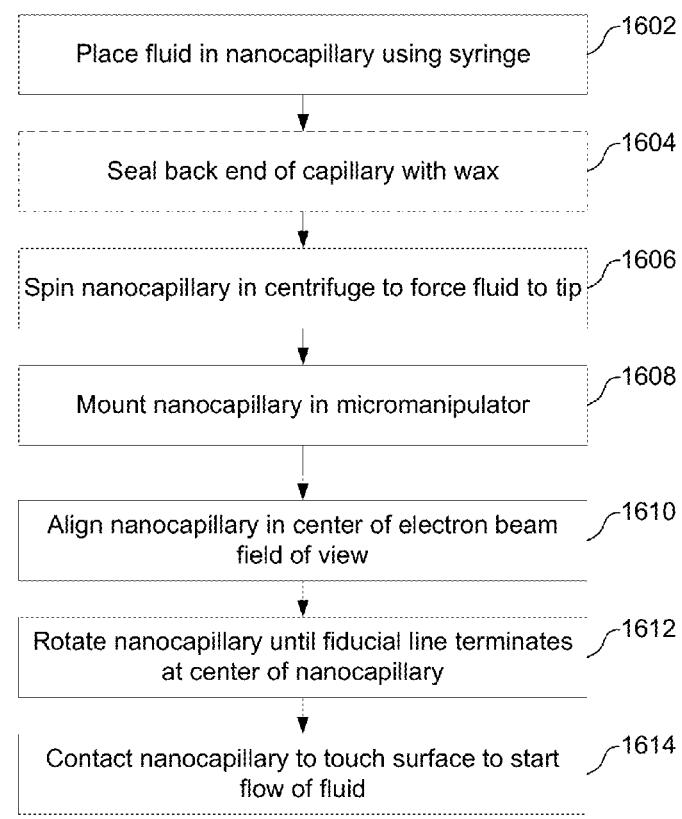
FIG. 16 is a flow chart showing a procedure for preparing the nanocapillary.
Figure 17A:
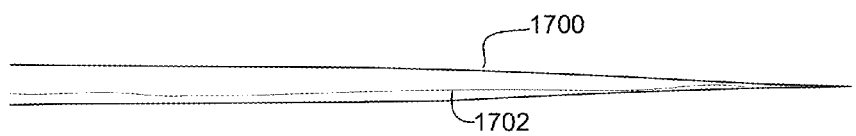
FIG. 17A-D shows a sequence of steps involved in filling the nanocapillary.
Figure 17B:
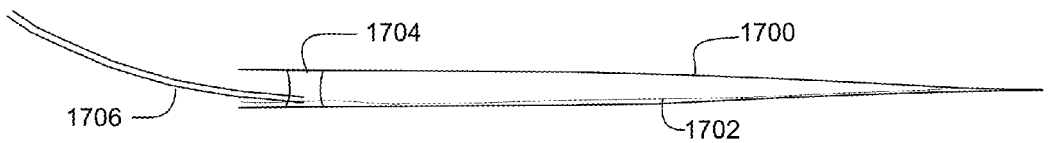
Figure 17C:
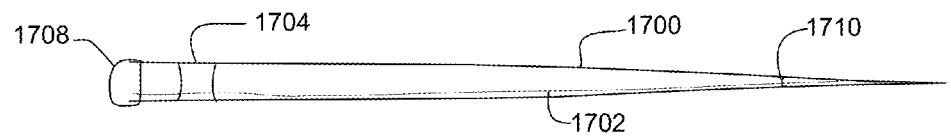

FIG. 16 describes a method for filling a nanocapillary. FIG. 17 illustrates various steps of the process shown in FIG. 16. FIG. 17 is adapted in part from FIG. 4.3 from "Donnermeyer, A. 2007. Thesis. Scanning ion-conductance microscopy. Bielefeld (Germany): Bielefeld University". FIG. 17A shows a nanocapillary 1700, which includes an internal filament 1702 to facilitate filing. In step 1602, illustrated by FIG. 17B, a fluid 1704 is placed inside the nanocapillary by filling it from the backside using a microloader 1706. The microloader is a syringe with a tip capable of fitting in the backside of the nanocapillary, where the diameter is about 250 microns. Although the internal filament in the nanocapillary causes some fluid 1704 to travel to the tip as shown by meniscus 1710 in FIG. 17C, much of the fluid remains away from the tip because of the small diameter of the nanocapillary 1700. Optionally, in step 1604, the back end of the nanocapillary is sealed with vacuum compatible wax 1708 to prevent the fluid inside the nanocapillary from evaporating into the vacuum from the back end of the nanocapillary. The wax used can be, for example, Apiezon Wax W. Mild heat (approximately 110° C.) can be used to melt the wax and provide a good vacuum-tight seal. The fluid is thus effectively sealed inside the nanocapillary. If wax is not used to seal the back end of the nanocapillary then the metal section 1808 in FIG. 18 (described below) should be sealed to ensure that the fluid is sealed inside the nanocapillary and cannot evaporate via the back side into the vacuum chamber.

Figure 17D:
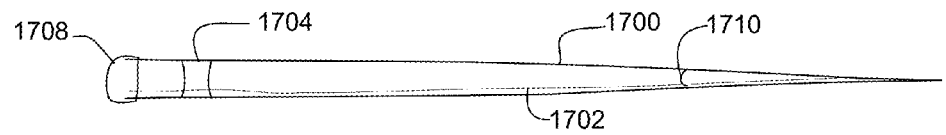

To facilitate filling of the tip of the nanocapillary, it is placed in a customized centrifuge. An example of a customized centrifuge uses a rotor from a 12 V computer fan, model FAN 3701U from StarTech. In step 1606, the centrifuge is operated, for example, at 5000 rpm for 30 minutes, which is sufficient for reproducible and reliable filling of the nanocapillary tip with fluid. FIG. 17D shows the nanocapillary after step 1606 showing the additional fluid at the tip as shown by the movement of meniscus 1710. In step 1608, the nanocapillary is attached to the micromanipulator. Good electrical contact between the conductive coating on the nanocapillary and the metal of the micromanipulator can be provided by applying silver paint to the junction. The drying of the silver takes about 10-20 minutes, and two layers are typically applied. The nanocapillary is then ready for use. The flow from the nanocapillary to the substrate or surface is primarily due to capillary forces, and as such, the tip of the nanocapillary contacts the substrate directly to induce a flow.

In step 1610, nanocapillary 1402 in the micromanipulator is aligned to the center of an electron beam. In step 1612, nanocapillary 1402 is rotated to locate the fiducial marks 1420, and the nanocapillary is oriented so that the horizontal fiducial line terminates at the center of nanocapillary 1402 as viewed with the electron beam. Nanocapillary 1402 is then ready to locally deliver fluid to the substrate 1430 in step 1614.

Figure 18:
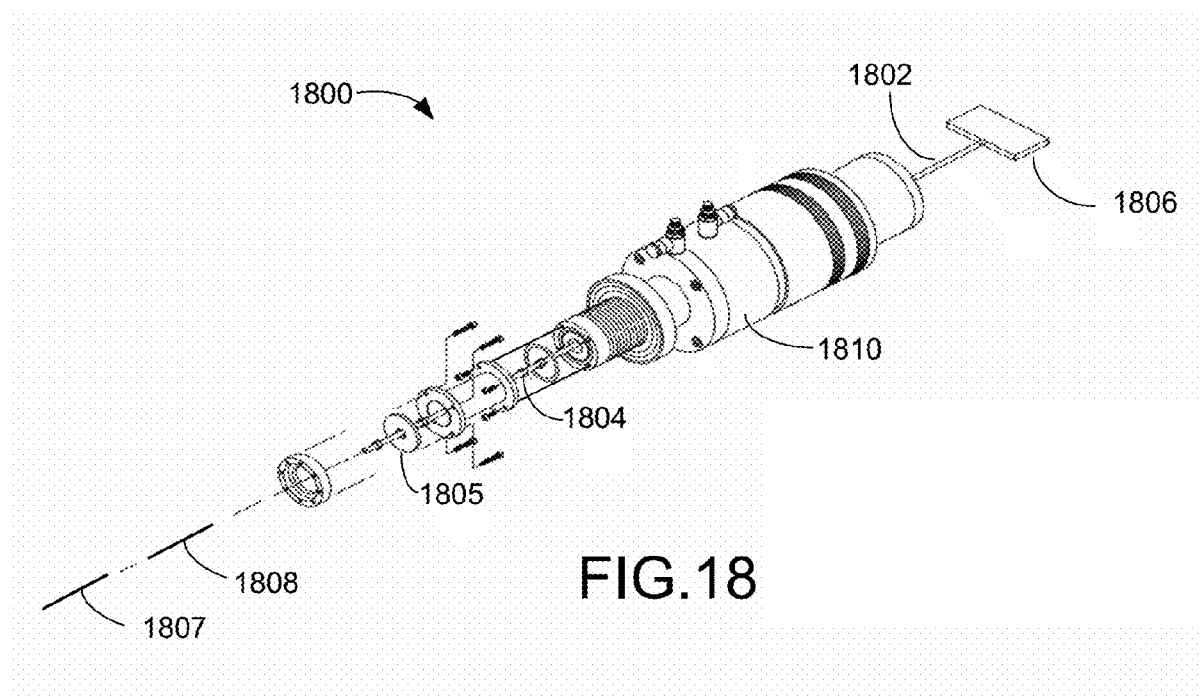
FIG. 18 shows a modified GIS assembly used to hold a nanocapillary.

Because many charged particle beam systems include a gas injection system (GIS) for beam induced deposition and etching, and the gas injection system typically has the movement capabilities required for the nanocapillary, it is convenient to attach the nanocapillary to an existing GIS. FIG. 18 shows a modified GIS assembly 1800 that provides the necessary positioning capability. That is, the modified GIS assembly includes the ability to insert, to retract, to rotate, and to adjust the position of the inserted nanocapillary. The modified GIS housing mounts to the wall of the vacuum chamber walls at a known angle, so the nanocapillary is inserted at a well defined angle with respect to the surface.

Modified GIS assembly 1800 includes metal rod 1802 which spans the entire length of GIS 1810. One end of metal rod 1802 includes a handle 1806 to provide easy rotational, insertable, and retractable movement of the nanocapillary for in chamber applications. The vacuum seal of metal rod 1802 is provided by a series of small o-rings 1804 spaced along the length of metal rod 1802. The vacuum seal has been shown to work down to chamber pressures of $2 \times 10^{-6}$ mbar, and it is still possible to rotate central rod 1802 at this vacuum level without causing a gas burst or leak.

A nanocapillary 1807 is attached to an intermediate metal section 1808. A silicone o-ring 1805 can be used to hold the metal section 1808 to provide a vacuum seal. The intermediate metal section 1808 screws into rod 1802.

Preferably, metal rod 1802 is electrically isolated from the shell of GIS assembly 1810 to allow an electrical bias to be applied to the nanocapillary. This is useful in cases where the nanocapillary functions as the anode or cathode in electrochemical circuits. If the nanocapillary is to be grounded to the chamber, a simple grounding connection can easily be made.

Some embodiments, such as the automated deposition aspect using pattern recognition software and feedback, can be practiced in air, outside a vacuum chamber. Embodiments that use a charged particle beam are practiced within a vacuum chamber used for charged particle beam processing. Some embodiments that are practiced within a vacuum chamber use an electrolyte having low or negligible vapor pressure, such as a neoteric liquid, while other embodiments use a convention, higher vapor pressure electrolyte.

Using an embodiment suitable for use within a charged particle beam vacuum chamber allows steps that require charged particle beam processing and steps that require electrochemical processing to be performed without repeatedly moving the work piece into and out of a vacuum chamber. Such embodiments eliminate the time consuming steps of moving the work piece in and out of the vacuum chamber and pumping down the vacuum chamber to an adequate vacuum between process steps. Also, maintaining the work piece within a vacuum chamber reduces contamination.

Because any conductive area within the electrochemical circuit and covered by the electrolyte will be affected by the electrochemical reaction, it is desirable in some applications to provide a barrier which insulates any exposed conductive area within the circuit that is to remain unaffected. A local insulating layer can be deposited using electron-beam-induced deposition, FIB deposition, chemical vapor deposition, or another process. The electrochemical process will not deposit or etch the work piece where protected by an insulating layer.

Embodiments of the invention are applicable to various aspects of nanotechnology, including "device editing," that is, adding or removing electrical paths to change the connections in a device such as an integrated circuit. Embodiments of the invention are useful in any application that requires precise localized deposition or etching of metals and other materials.

Also, the technique is not necessarily limited to depositing and etching conductors—charge transfer may also be used to deposit or remove polymer materials. The local electrochemical processes can be used on any surface to which an electrolyte can flow, and it is not limited, like beam processing, to processing along a line of sight from the beam source.

The term "contact" or "electrical contact" as used herein includes direct and indirect connections. While the invention is described primarily in terms of depositing or etching metals, the invention can be used to deposit or etch any material having sufficient conductivity to participate in electrochemical reaction.

The invention has multiple aspects that are separately patentable and not all aspects will be used in all embodiments.

Although the present invention and its advantages have been described in detail, it should be understood that various changes, substitutions and alterations can be made herein without departing from the spirit and scope of the invention as defined by the appended claims. The scope of the present application is not limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of locally depositing a material onto an insulating surface, comprising:
   a. applying an electrolyte to the insulating surface using a nano pen, said nano pen comprising a nanocapillary, a nano syringe, or a nanopipette and including an associated electrode, wherein applying an electrolyte to the insulating surface using a nano pen includes delivering the electrolyte to the insulating surface using the nanocapillary, the nano syringe, or the nanopipette; and
   b. applying a current through the electrolyte to initiate an electrochemical reaction to deposit a component of the electrolyte onto the insulating surface by:
applying an electrical potential to the associated electrode; and
directing a charged particle beam to supply electrical charges to the electrolyte.

2. The method of claim 1 in which applying an electrolyte to the insulating surface includes extracting the electrolyte from the nano pen using primarily capillary forces.

3. The method of claim 2 further comprising depositing a bubble of electrolyte having a diameter of less than 50 μm to the insulating surface.

4. The method of claim 3 in which the diameter is less than 5 μm.

5. The method of claim 2 in which:
   the nano pen comprises a nanocapillary having a diameter of less than 200 nm; and
   applying an electrolyte to the insulating surface includes locally applying an electrolyte using the nanocapillary.

6. The method of claim 1 in which locally applying using a nano pen an electrolyte to the insulating surface includes moving the nano pen in a pattern to deposit a material in the pattern.

7. The method of claim 1 in which:
   a. applying an electrolyte to the insulating surface using a nano pen includes providing an electrolyte bubble at a position where the nano pen contacts the insulating surface; and
   b. directing a charged particle beam to supply electrical charge to the electrolyte includes directing the charged particle beam to a layer of electrolyte at a point on the insulating surface outside of the electrolyte bubble.

8. The method of claim 7 in which the charged particle beam is supplied to a point at a distance from the electrolyte bubble of greater than three times the diameter of the electrolyte bubble.

9. The method of claim 7 further comprising moving the nano pen in a pattern to deposit material in the pattern.

10. The method of claim 9 further comprising scanning the electron beam in a pattern to deposit material in the pattern.

11. The method of claim 1 in which directing a charged particle beam includes directing an ion beam or an electron beam.

12. The method of claim 1 in which the electrode associated with the nano pen comprises a metallic coating on the nano pen or a wire in or on the nano pen.

13. The method of claim 1 in which:
   applying an electrolyte to the insulating surface using a nano pen includes providing an electrolyte bubble at a position where the nano pen contacts the insulating surface; and
   directing a charged particle beam to supply electrical charges to the electrolyte includes directing the charged particle beam to the electrolyte bubble or to within one diameter of the electrolyte bubble.

14. The method of claim 1 further comprising depositing an electrode on the insulating surface using beam-induced decomposition of a precursor gas and in which directing a charged particle beam to supply electrical charges to the electrolyte includes directing the charged particle beam to the deposited electrode.

15. The method of claim 1 further comprising:
   a. forming a charged particle beam image of the nano pen;
   b. using pattern recognition software, determine from the image a position of the nano pen;
   c. automatically comparing the determined position of the nano pen with a predetermined position; and
   d. automatically adjusting the position of the nano pen to reposition the nano pen based on a difference between an observed position and the predetermined position.

16. The method of claim 15 further comprising scanning the charged particle beam in a pattern to deposit material in the pattern.

* * * * *